United States Patent [19]

Gillingham et al.

[11] Patent Number: 5,625,601
[45] Date of Patent: Apr. 29, 1997

[54] DRAM PAGE COPY METHOD

[75] Inventors: Peter B. Gillingham, Kanata; Randy Torrance, Ottawa, both of Canada

[73] Assignee: Mosaid Technologies Incorporated, Kanata, Canada

[21] Appl. No.: 226,033

[22] Filed: Apr. 11, 1994

[51] Int. Cl.$^6$ .................................................. G11C 7/00
[52] U.S. Cl. .................. 365/220; 365/189.01; 365/238.5
[58] Field of Search ........................ 365/238.5, 220, 365/189.01, 203

[56] References Cited

U.S. PATENT DOCUMENTS

| | | | |
|---|---|---|---|
| 4,639,894 | 1/1987 | Ishii | 365/238.5 |
| 5,245,585 | 9/1993 | Voss et al. | 365/238.5 |
| 5,381,368 | 1/1995 | Morgan et al. | 365/220 X |

OTHER PUBLICATIONS

"Serial–Access Page–Mode Memory," by R.E. Scheuerlein, IBM Technical Disclosure Bulletin, vol. 27, No. 7B, Dec. 1984, pp. 4426–4428.

*Primary Examiner*—David C. Nelms
*Assistant Examiner*—Son Dinh
*Attorney, Agent, or Firm*—Pascal & Associates

[57] ABSTRACT

A method of transferring data into or out of plural memory cells of a dynamic random access memory (DRAM) comprised of precharging bitlines of the DRAM for a predetermined interval, addressing a first group of wordlines for a first period of time, after the first period of time, addressing a second group of wordlines for a second period of time, the first and second periods of time being contained within the predetermined interval, addressing and sensing a first group of memory cells from the first group of wordlines for an interval within the first period of time, addressing a second group of memory cells from the second group of wordlines within the second period of time, and transferring sensed bits from the first group of memory cells to the second group of memory cells while the second group of memory cells is being addressed.

5 Claims, 3 Drawing Sheets

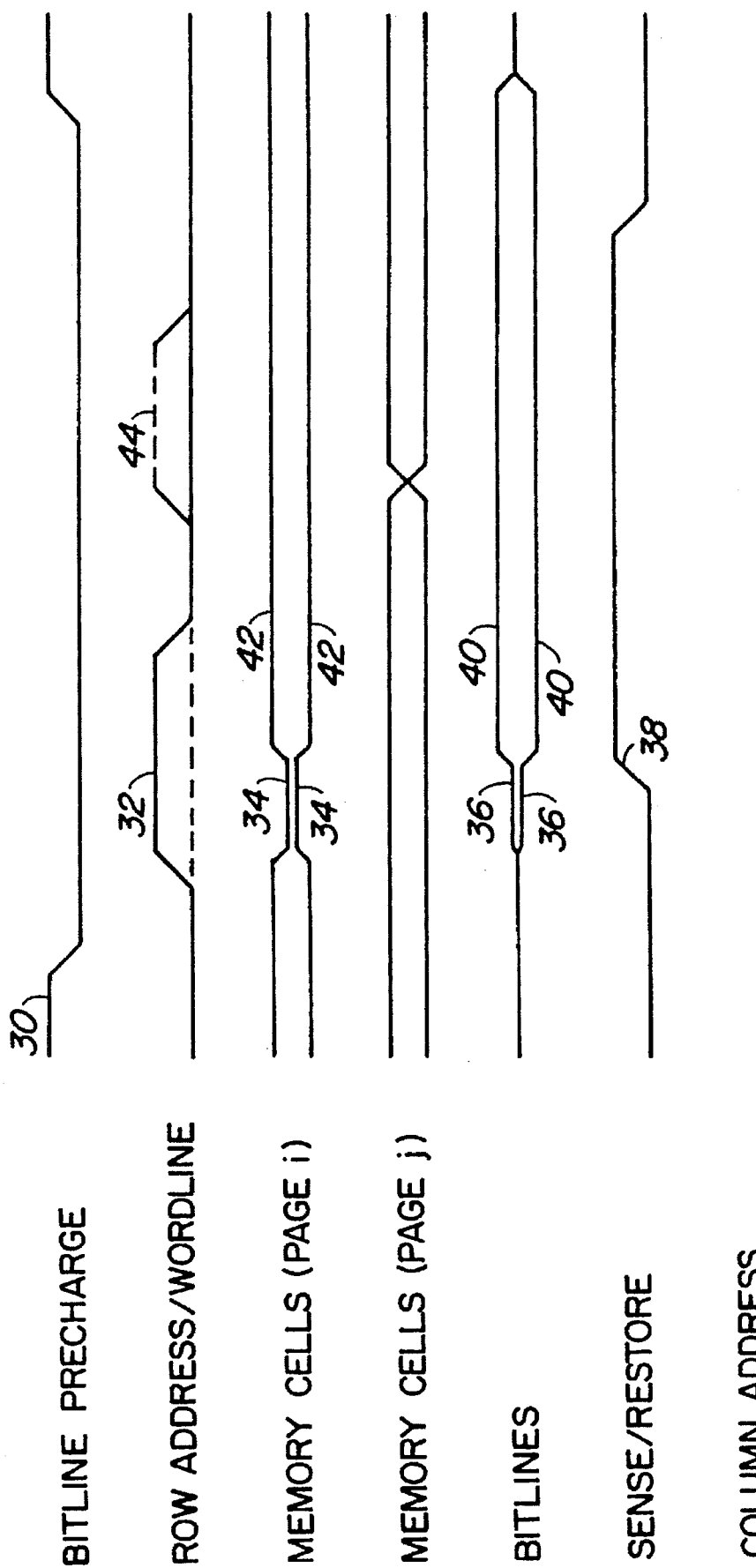

DRAM PAGE COPY METHOD

FIELD OF THE INVENTION

This invention relates to semiconductor dynamic random access memories (DRAMS) and in particular to a fast method of copying data from one group of memory cells to another (page to page copying).

BACKGROUND TO THE INVENTION

DRAMs are typically formed of orthogonally disposed word lines and bit lines, with charge storage cells adjacent each intersection addressed via the wordlines and connected to the bit lines. Each charge storage cell stores a charge received from a bit line when it is addressed, that designates the value (0 or 1) of a bit. Bit lines are typically in a well known folded form, formed of two conductors, that interface a data bus via a sense amplifier and column access devices, such as field effect switches that are addressed via a column decoder.

Pertinent circuitry of a typical prior art DRAM is illustrated in FIG. 1. A charge storage cell 1 is formed of a capacitor 2A connected in series with a field effect transistor 2B (FET) between a voltage supply Vcc and a conductor of a folded bitline 3. The gate of the FET is connected to a wordline 4. The bitline is connected to a sense amplifier 5. Each output conductor of the sense amplifier is connected through an FET 6 to a corresponding conductor of a data bus 8. The gates of FETs 6 are connected together to the output of a column decoder, which provides the control signal Yj, Y(j+1) which is a decoded column address signal to those gates.

The conductors of data bus 8 are connected differentially to the input of a read amplifier 9 and to the output of a write amplifier 10. A source of precharge voltage Vcc/2 is applied from leads Vblp via precharge control FETs 12A, 12B and 13A, 13B to corresponding conductors of the data bus 8 and to the folded bitline 3 respectively. The pairs of conductors of data bus 8 and the conductors of bitline 3 can also be connected together for equalization through FETs 14 and 15 respectively. The gates of FETs 12A, 12B and 14 are connected to a source of a gate precharge enable control signal, PRE. Gates of FETs 13A, 13B and 15 are connected together and to a bitline precharge enable control signal. A write enable signal WMA is provided to a control input of the write amplifier, and a read enable signal RMA is provided to a control input of the read amplifier.

A page of a DRAM is defined as the memory locations accessed by a unique row address. After sensing, a page of data is held in the bitline sense amplifiers and can be accessed in small increments addressed by the Y-decoder.

It is sometimes desired to copy data from one page of the DRAM to another. In such cases it was necessary to read the data out of each column address location of the page sequentially and to write the read data into a column address, using a location on another page address cycle for each read and a row address and column address cycle for each row and column write step.

FIG. 2 illustrates a write sequence for a single column address in the aforenoted operation. Bitline precharge voltage is applied to bitlines 3 for an interval 20, and is then disabled, leaving the bitlines floating. A wordline 4 is addressed for a period of time 22. Upon addressing a wordline, data stored in the capacitors of memory cells 2A is passed to the respective folded bitlines, as indicated at 24A, 24B, 24C and 24D. The level is attenuated due to charge sharing between cell capacitance and bitline capacitance. The sense amplifiers are then enabled during a period of time 32, restoring the data on the bitlines and memory cells to full logic levels of the signal on the wordline, as shown at 26A, 26B, 26C and 26D. The column address of memory cell 1 (of N columns) is then enabled during an interval 27, and bitlines 26A and 26B reverse logic levels during the address interval, due to the opposite polarity of the write data, while the remaining bitlines 30 do not since the corresponding access devices are not enabled. The address interval then ends, followed by the sense (restore) interval 32, followed by the precharge interval.

The read sequence is identical to the write sequence up until the bitline sense amplifiers are enabled. Then the column decoder enables databus access devices 6 to transfer read data to the databus, which is then sensed by the read RMA sense amplifier.

The above sequence takes a considerable amount of time, due to the requirement to do sequential addressing.

SUMMARY OF THE INVENTION

The present invention is a method of transferring data into or out of plural memory cells of a DRAM within the same cycle, whereby bits of data can be transferred from one cell through the databus to another cell significantly faster than the aforenoted prior art method.

In accordance with an embodiment of the invention, a method of transferring data in a DRAM between plural memory cells addressed from a first wordline to a corresponding group of memory cells addressed from a second wordline, is comprised of transferring data bits from said memory cells addressed from the first wordline to bitlines common to memory cells addressed to both first and second wordlines, and transferring the bits from the bitlines to the memory cells addressed from the second bitline.

The preferred method includes transferring the data bits together from the cells addressed from the first wordline to the bitlines in a first step, and transferring the data bits from the bitlines together to the cells addressed from the second wordline in a second step.

In accordance with another embodiment, a method of transferring data into or out of plural memory cells of a dynamic random access memory (DRAM) is comprised of precharging bitlines of the DRAM for a predetermined interval, addressing a first group of wordlines for a first period of time, after said first period of time, addressing a second group of wordlines for a second period of time, said first and second periods of time being contained within said predetermined interval, addressing and sensing a first group of memory cells from said first group of wordlines for an interval within said first period of time, addressing a second group of memory cells from said second group of wordlines within said second period of time, and transferring sensed bits from the first group of memory cells to said second group of memory cells while the second group of memory cells is being addressed.

BRIEF INTRODUCTION TO THE DRAWINGS

A better understanding of the invention will be obtained by reading the description of the invention below, with reference to the following drawings, in which:

FIG. 3 is a timing diagram that illustrates operation of the portion of the DRAM in accordance with the present invention.

DETAILED DESCRIPTION OF THE INVENTION

Figure 1:
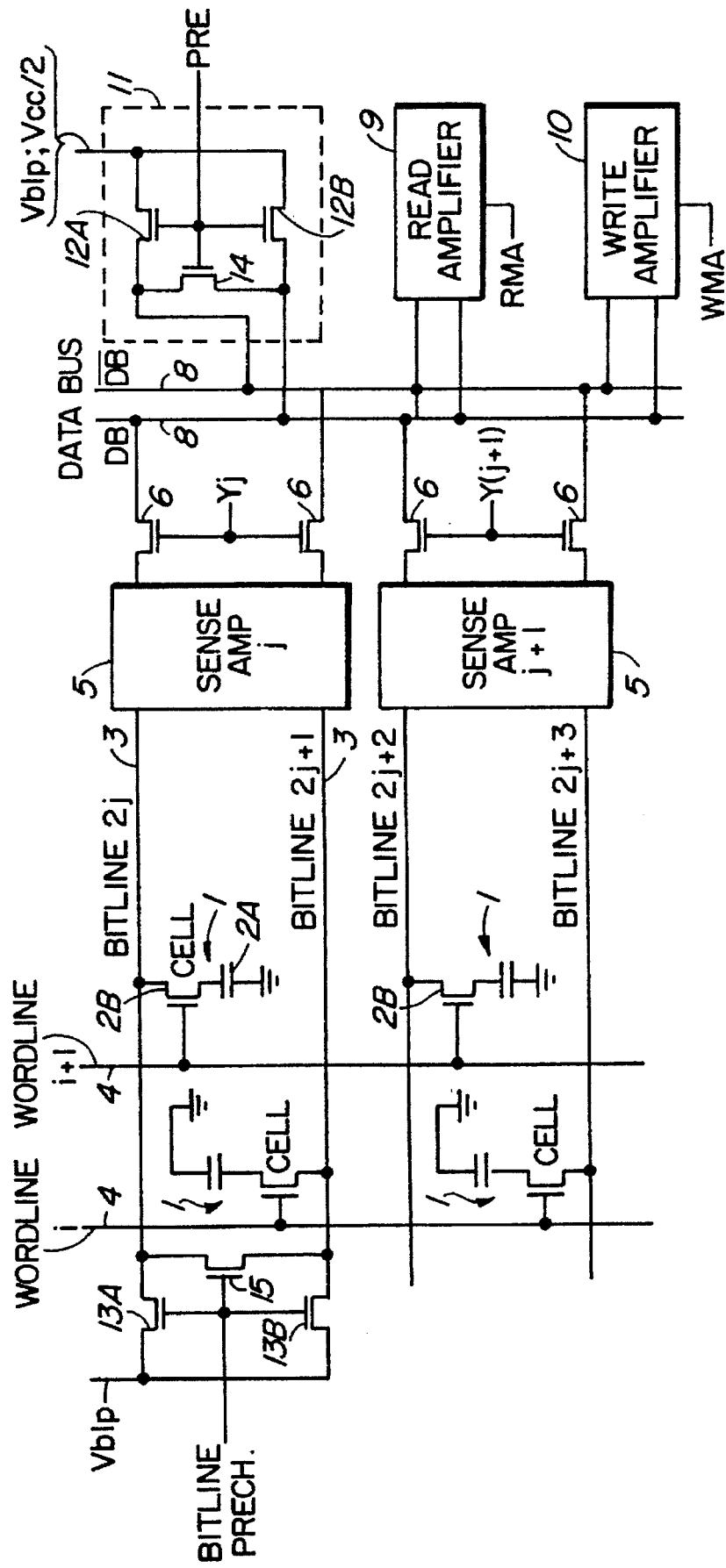
FIG. 1 is a schematic of a portion of a DRAM.
Figure 2:
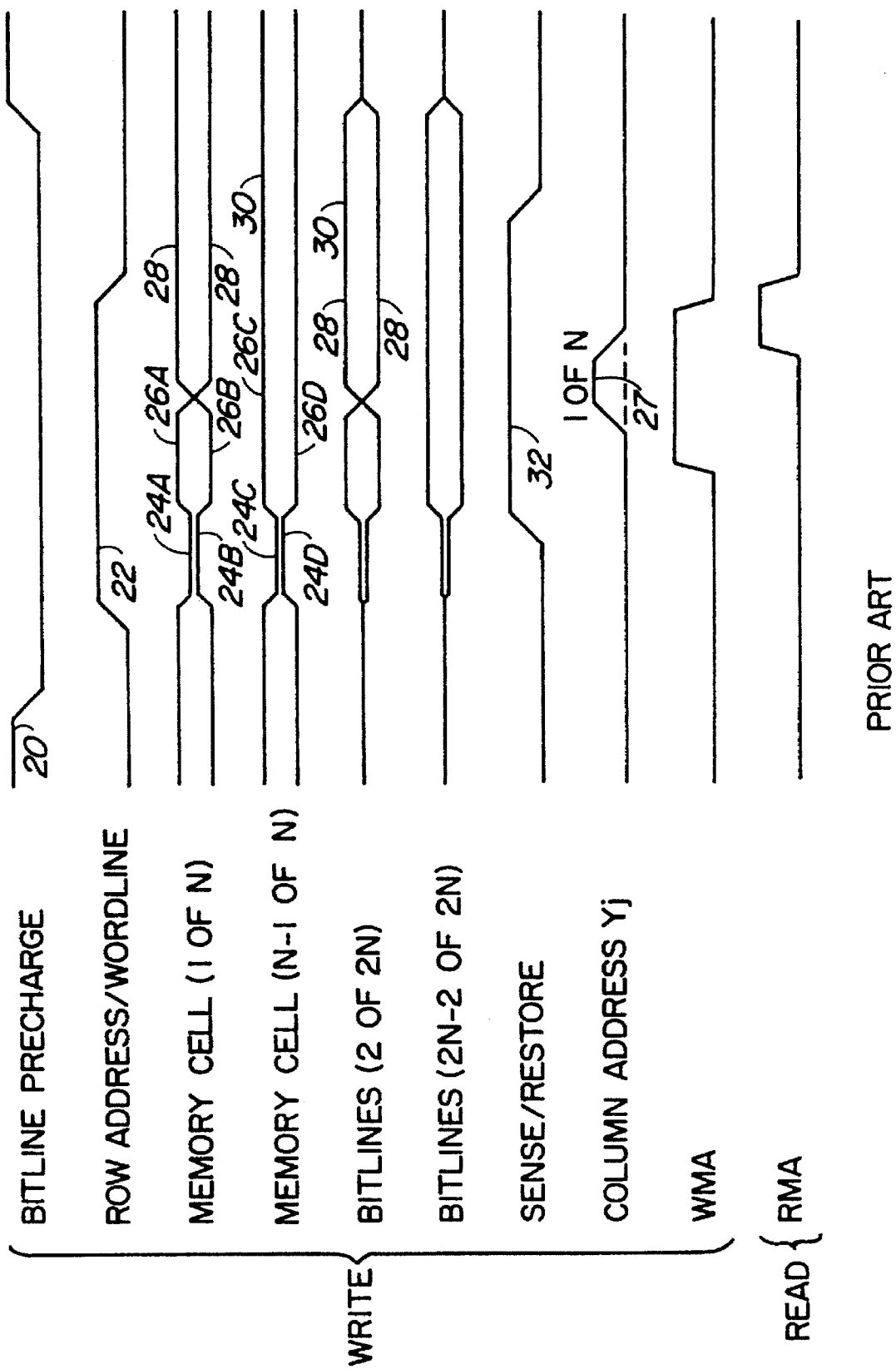
FIG. 2 is a timing diagram that illustrates operation of the portion of the DRAM in accordance with the prior art.

Turning now to FIG. 3, the bitlines are precharged to a predetermined voltage which could be between the two supply voltages Vcc and Vss, during a predetermined interval 30. A first wordline (i) is addressed for a first period of time 32, which begins after the end of precharge interval 30. Immediately after the wordline (i) has been addressed, data in all of the memory cells connected to wordline 4 (i) is transferred to the bitlines, attenuated as a result of charge sharing between bitline capacitance and cell capacitance during an interval 34. The voltage on the bitline leads is shown in timing lines 36.

The sense amplifiers are then activated, to sense and restore the bit logic levels of the memory cell capacitors appearing on the bit line leads, as shown by timing line 38. Upon completion of sensing (high logic level in timing line 38), the precharge interval begins and bitlines are once again equalized and maintained at the predetermined precharge voltage level in anticipation of the next cycle.

During the sensing interval, the wordline corresponding to page i is deselected, and another wordline j, (j+1) is addressed, for a period 44, also within the sensing interval 30. Now, however, the associated bitlines remain charged to the full logic levels that were sensed from the cells addressed from wordline i. This logic level, is thus transferred to the cell capacitors associated with wordline j, (j+1) since by addressing wordline j, (j+1) the associated passthrough field effect transistors 2B are thereby enabled.

The sense and restore interval 38 then ends, followed by the bitline precharge interval. Upon the bitline precharge interval ending, the bitline voltage returns to an intermediate resting voltage.

Bits stored in cells associated with a wordline are thus transferred in parallel to corresponding cells associated with another wordline, achieving a very fast page to page copying sequence without data being required to be transferred to a databus, and thus speeding up operation of the DRAM for considerably.

In another mode of operation, a copy can be performed from one page to n pages of memory by raising n wordlines. With reference to FIG. 3, rather than raising only a single wordline j, (i.e. j, (j+1)), many wordlines j, k, l, etc. are raised.

This operates as long as the capacitance of the n memory cells which are connected to the bitlines is less than the bitline capacitance. Typically the cell capacitance to bitline capacitance is $(C_c/C_{bl}) \sim 1/10$. Therefore the number of pages which can be written in parallel is n<10.

A person understanding this invention may now conceive of alternative structures and embodiments or variations of the above. All of those which fall within the scope of the claims appended hereto are considered to be part of the present invention.

I claim:

1. A method of transferring data into or out of plural memory cells of a dynamic random access memory (DRAM) comprising:
   (a) precharging bitlines of the DRAM for a predetermined interval,
   (b) addressing a first group of wordlines for a first period of time,
   (c) after said first period of time, addressing a second group of wordlines for a second period of time, said first and second periods of time being contained within said predetermined interval,
   (d) addressing and sensing a first group of memory cells from said first group of wordlines for an interval within said first period of time,
   (e) addressing a second group of memory cells from said second group of wordlines within said second period of time, and
   (f) transferring sensed bits from the first group of memory cells to said second group of memory cells at the same time directly via the bitlines while the second group of memory cells is being addressed.

2. A method of transferring data in a DRAM between plural memory cells addressed from a first wordline to a corresponding group of memory cells addressed from a second wordline, comprising transferring data bits from said plural memory cells addressed from the first wordline to bitlines common to memory cells addressed by both first and second wordlines, and transferring the bits at the same time from the bitlines to the group of memory cells addressed from the second wordline, wherein capacitance of the memory cells connected to said common bitlines is less than capacitance of the bitlines.

3. A method as defined in claim 2, including transferring the data bits together from the memory cells addressed from the first wordline to said common bitlines in a first step, and transferring the data bits from said common bitlines together to the cells addressed from the second wordline in a second step.

4. A method of transferring data in a DRAM between plural memory cells addressed from a first wordline to corresponding memory cells addressed from plural second wordlines, comprising transferring data bits from said memory cells addressed from the first wordline to bitlines common to memory cells addressed from both said first wordline and said plural second wordlines in a first step and transferring the data bits at the same time from the common bitlines to the groups of memory cells addressed from the plural second wordlines in a second step, wherein capacitance of the memory cells connected to said common bitlines is less than capacitance of the bitlines.

5. A method as defined in claim 4 in which the numbers of groups of memory cells addressed from the plural second wordlines is between one and nine.

* * * * *